(12) United States Patent
Cho

(10) Patent No.: US 6,495,768 B1
(45) Date of Patent: Dec. 17, 2002

(54) TAPE CARRIER PACKAGE AND METHOD OF FABRICATING THE SAME

(75) Inventor: Hyoung Soo Cho, Seoul (KR)

(73) Assignee: LG. Philips LCD Co., LTD, Seoul (KR)

( * ) Notice: Subject to any disclaimer, the term of this patent is extended or adjusted under 35 U.S.C. 154(b) by 0 days.

(21) Appl. No.: 09/620,211

(22) Filed: Jul. 20, 2000

(30) Foreign Application Priority Data

Feb. 23, 2000 (KR) .......................................... 2000-08666

(51) Int. Cl.$^7$ .......................... G02F 1/1345; H05K 1/11
(52) U.S. Cl. ...................... 174/250; 174/261; 174/268; 361/777; 349/150; 349/152; 257/775; 438/113; 29/847
(58) Field of Search ................................. 361/748–751, 361/777, 784; 349/149–152; 324/754, 757, 765; 257/775; 174/268, 261, 250; 438/113; 29/847

(56) References Cited

U.S. PATENT DOCUMENTS

| | | | | |
|---|---|---|---|---|
| 4,951,098 A | * | 8/1990 | Albergo et al. | 257/775 |
| 4,985,663 A | * | 1/1991 | Nakatani | 349/150 |
| 5,305,130 A | * | 4/1994 | Yamawaki | 349/150 |
| 5,889,572 A | * | 3/1999 | Takahashi et al. | 349/149 |
| 6,059,624 A | * | 5/2000 | Dehaine et al. | 349/150 |
| 6,080,602 A | * | 6/2000 | Tani et al. | 438/113 |
| 6,201,689 B1 | * | 3/2001 | Miyasyo | 361/748 |

* cited by examiner

Primary Examiner—Kamand Cuneo
Assistant Examiner—John B. Vigushin
(74) Attorney, Agent, or Firm—McKenna Long & Aldridge

(57) ABSTRACT

A tape carrier package that is capable of preventing a short between adjacent pads in boning the tape carrier package mounted with an integrated circuit onto a liquid crystal panel and a print wiring substrate. In the package, a base film is mounted with an integrated circuit. Input pads are connected to the integrated circuit to input an external input signal to the integrated circuit. Each of output pads has a first portion extended to the integrated circuit, and a second portion extended to the first portion to have a narrower line width than the first portion.

12 Claims, 8 Drawing Sheets

TAPE CARRIER PACKAGE AND METHOD OF FABRICATING THE SAME

BACKGROUND OF THE INVENTION

This application claims the benefit of Korean patent application number P2000-0866, filed Feb. 23, 2000 which is hereby incorporated by reference for all purposes as if fully set forth herein.

1. Field of the Invention

This invention relates to an apparatus for mounting an integrated circuit in a liquid crystal display, and more particularly to a tape carrier package that reduces the possibility of a short between adjacent pads when bonding the tape carrier package to a liquid crystal panel and/or a printed wiring substrate. Also, the present invention is related to a method of fabricating such a tape carrier package.

2. Description of the Related Art

Generally, an active matrix liquid crystal display uses thin film transistors (TFTs) as switching devices to display natural-looking moving pictures. Since such a liquid crystal display can be made into a smaller-size device than a cathode ray tube, it is commercially viable for use a monitor such as a portable television, lap-top personal computer or other consumer device.

The active matrix liquid crystal display displays a picture corresponding to video signals such as television signals on a pixel (or picture element) matrix having pixels arranged at each intersection between gate lines and data lines. Each pixel includes a liquid crystal cell for controlling a transmitted light quantity in accordance with a voltage level of a data signal from a data line. A TFT (thin film transistor) is installed at an intersection between a gate line and a data line to switch a data signal to be transferred to the liquid crystal cell in response to a scanning signal (i.e., a gate pulse) from the gate line.

Such a liquid crystal display requires a number of integrated circuits (ICs) connected to the data lines and the gate lines to apply data signals and scanning signals to the data lines and the gate lines, respectively. The ICs are installed between the print wiring board (PWB) and the liquid crystal panel to apply signals supplied from the PWB to the data lines and the gate lines. IC mounting methods include chip on board, hereinafter referred to as "COB", tape automated bonding, hereinafter referred to as "TAB", and a chip on glass, hereinafter referred to as "COG". (Other methods are also possible). The COB system is mainly used for monochromatic liquid crystal displays having a pixel pitch of more than 300 μm. As shown in FIG. 1, in this COB system, ICs 8 are mounted on a PWB 6 and a heat-seal connector 10 connects the PWB 6 and a glass substrate 3 in a liquid crystal panel 2. In this case, a back light unit 4 used as a light source is provided between the liquid crystal panel 2 and the PWB 6. As shown in FIG. 2, in the TAB system, ICs 14 are mounted on a tape carrier package (TCP) 12. The TCP 12 is connected between the PWB 6 and the liquid crystal panel 3. As shown in FIG. 3, in the COG system, an IC chip 20 is directly mounted on a glass substrate 17 in a liquid crystal panel 16.

The above-mentioned TAB IC mounting method has been widely employed because it can widen an effective area of the panel and has a relatively simple mounting process.

As shown in FIG. 4, the TCP 12 employed in the TAB system includes a base film 22 on which is mounted an IC 14. The base film 22 is also provided with input and output pads 24 and 26 connected to input and output pins of the IC 14. The input and output pads 24 and 26 have a two-layer structure in which copper(Cu) is plated with tin(Sn) for preventing oxidation. Line widths of the input pads 24 are set to be larger than those of the output pads 26. As shown in FIG. 5, the input pads 24 of the base film 22 are connected, via an anisotropic conductive film (ACF) 30, to pads 28 on the PWB 6. The output pads 26 are also connected via the ACF 30 to pads 28 on the liquid crystal panel 2.

However, the IC mounting method employing the TAB system has a problem in that a conductive alien substance produced from a cutting process of TCP 12 may generate a short between the pads 28 on the liquid crystal panel 2 or the PWB 6 and the pads 24 and 26 of the base film 22, respectively as shown in FIG. 5. More specifically, the TCP 12 is formed on a flexible polyimide film roll (FPFR) 32 and then is cut into the shape shown by the dashed line 40 in FIG. 6. In this case, the input and output pads 24 and 26 extend outside of a cutting line 40. At this time, as seen from FIG. 7A and FIG. 7B, the input pads 24 have the same line width at the inside and outside of the cutting line 40. The output pads 24 also have the same line width inside and outside of the cutting line 40. In FIG. 7A and FIG. 7B, a bonding layer 27 functions to adhere the input and output pads 24 and 26 on the base film 22. An extension of the input and output pads 24 and 26 into a dummy area outside of the cutting line 40 aims at electrically testing whether or not there is a defect in the IC 14, the pads 24, 26 and/or the interconnection pattern between the IC 14 and the pads 24, 26, before the base film 22 has been cut. After the test, the base film 22 and the input and output pads 24 and 26 are cut along the cutting line 40. At this time, a portion of the input and output pads 24 and 26 on the cutting line 40 may come off due to friction between a cutter (not shown) and the input and output pads 24 and 26. A conductive alien substance 42 generated in this manner is adhered to the TCP 12 by static electricity such that the material 42 is loaded into a pad bonding equipment (not shown) along with the TCP 12. This conductive alien substance 42 is interposed between the pads 28 of the PWB 6 or the liquid crystal panel 2 and the input and output pads 24 and 26 as shown in FIG. 5 during the pad bonding process, which causes an insulation breakdown of the ACF 30. As a result, the pads 28 on the adjacent PWB 6 or liquid crystal panel 2 and/or the input and output pads 24, 26 are short-circuited due to the conductive alien substance 42. Particularly, as line widths of the input and output pads 24 and 26 on the cutting line 40 are relatively wide, so too is the size of the conductive alien substance 42. Since a distance between panels in a high-resolution liquid crystal display is narrow, a conductive alien substance 42 with a small size also may cause a short between panels in such a high-resolution liquid crystal display.

SUMMARY OF THE INVENTION

Accordingly, it is an object of the present invention to provide a tape carrier package that reduces the possibility of a short between adjacent pads.

A further object of the present invention is to provide a method of fabricating a tape carrier package that reduces the possibility of a short between adjacent pads.

In order to achieve these and other objects of the invention, a tape carrier package according to one aspect of the present invention includes a base film for mounting an integrated circuit; input pads connected to the integrated circuit and output pads connected to the integrated circuit, each of the output pads including a first portion adjacent to the integrated circuit and a second portion extended from the first portion, wherein the second portion has a narrower line width than the first portion.

A method of fabricating a tape carrier package according to another aspect of the present invention includes the steps of forming input pads at the inside of a coating line of the tape carrier package on a base film; forming output pads including a first portion connected to an integrated circuit on the base film, a second portion positioned at the cutting line and having a narrower line with than the first portion, and a third portion extending from the second portion and having a wider line width than the second portion; mounting the integrated circuit on the base film; connecting the input pads and the first portions; to the integrated circuit and the base film along the cutting line.

BRIEF DESCRIPTION OF THE DRAWINGS

These and other objects of the invention will be apparent from the following detailed description of preferred embodiments of the present invention with reference to the accompanying drawings, in which:

FIG. 5 is a plan view showing a connection between the input and output pads of the tape carrier package shown in FIG. 2 and the pads on a liquid crystal panel or a printed wiring board shown in;

DETAILED DESCRIPTION OF THE PREFERRED EMBODIMENT

Figure 1:
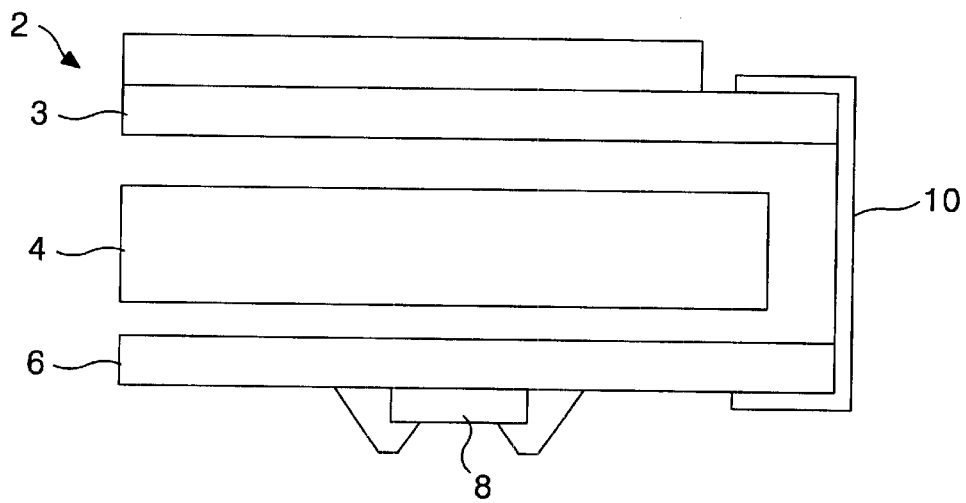
FIG. 1 is a side view showing an integrated circuit mounting method employing the conventional chip on board system.
Figure 2:
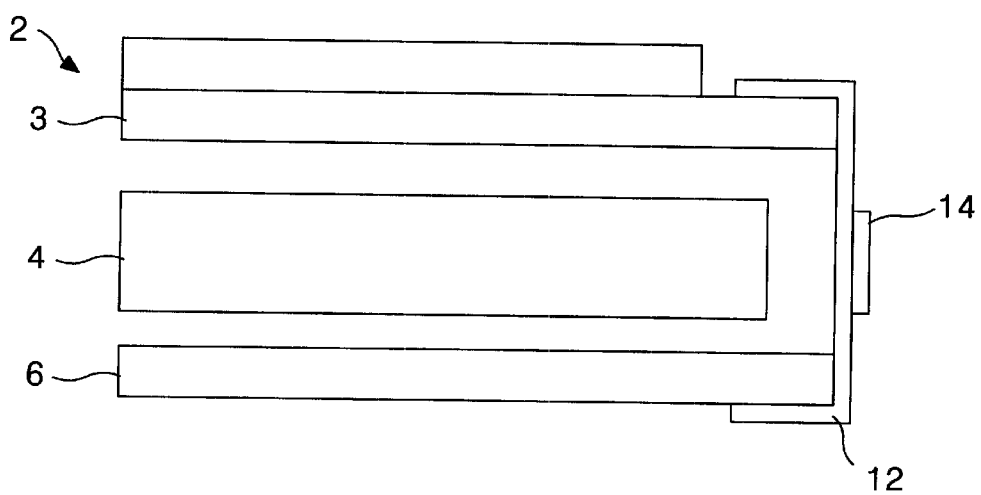
FIG. 2 is a side view showing an integrated circuit mounting method employing the conventional tape automated bonding system.
Figure 3:
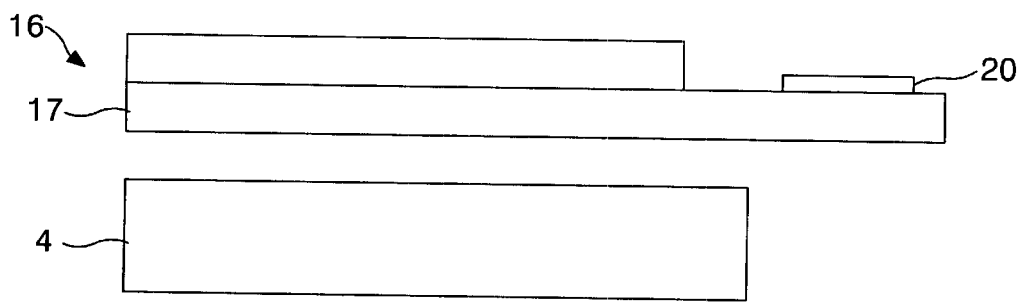
FIG. 3 is a side view showing an integrated circuit mounting method employing the conventional chip on glass system.
Figure 4:
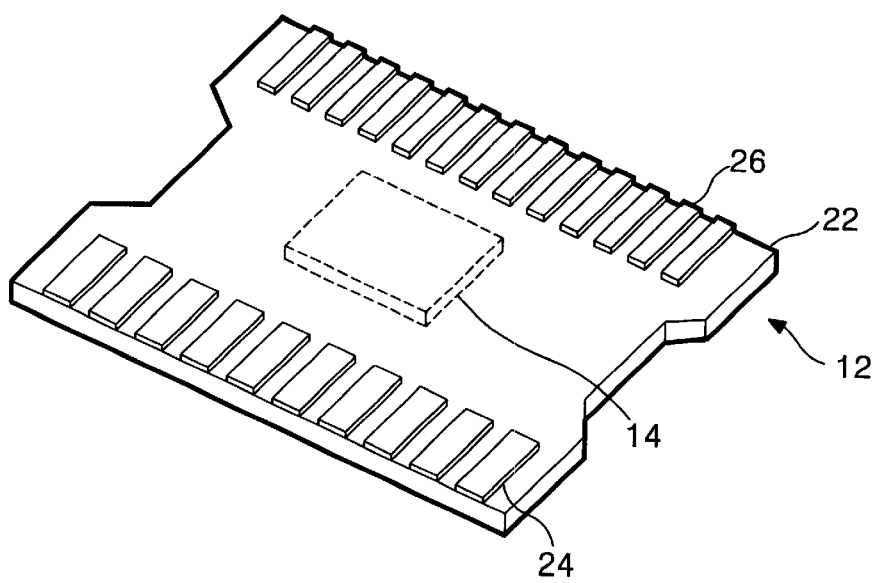
FIG. 4 is a perspective view showing the structure of the tape carrier package shown in FIG. 2.
Figure 5:
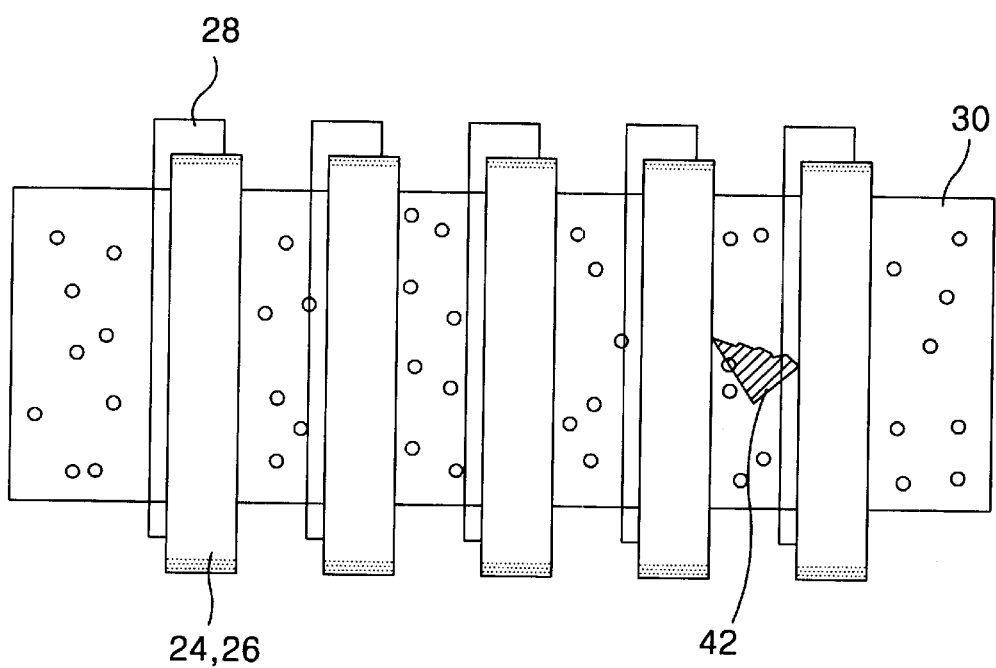
Figure 6:
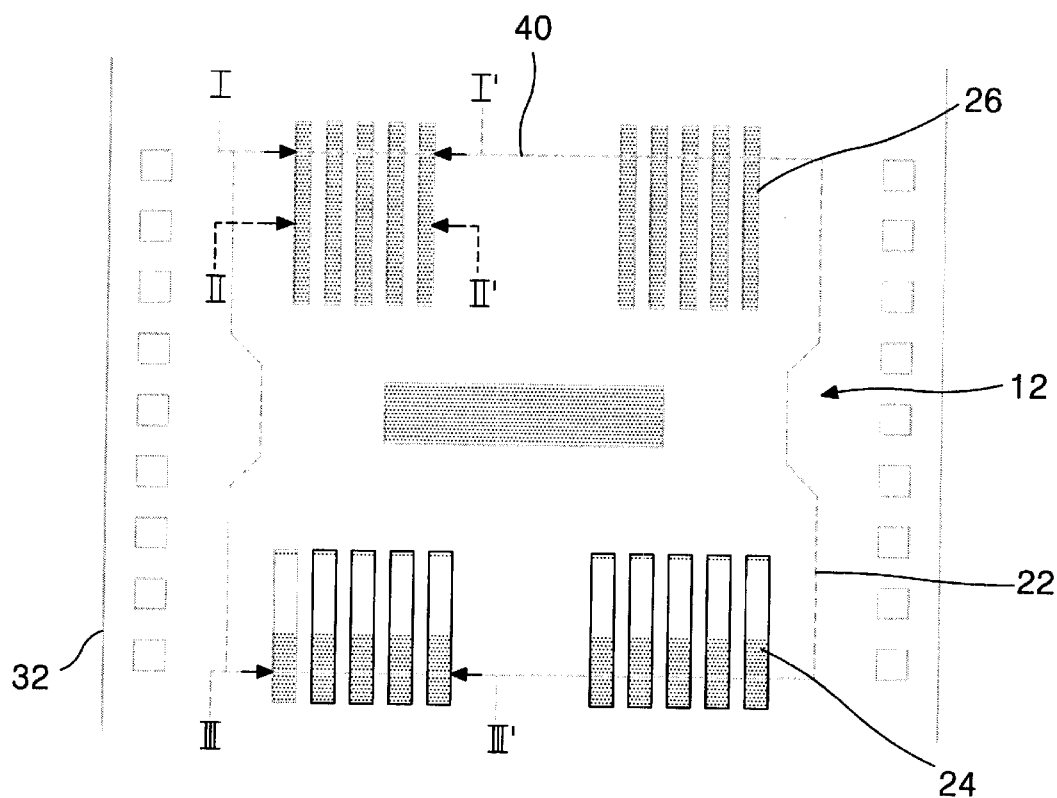
FIG. 6 is a plan view showing the tape carrier package of FIG. 2 in an uncut state.
Figure 7A:
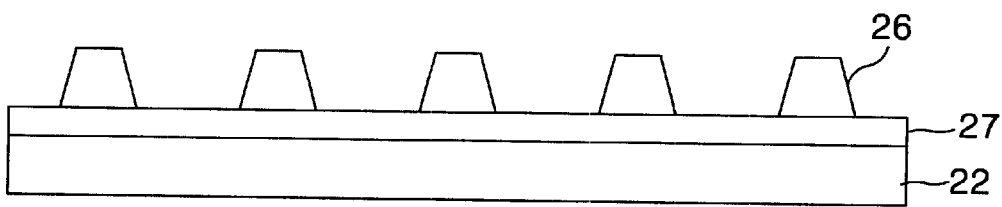
FIG. 7A is a cross sectional view of the input pads taken along lines A–A' and B–B' of FIG. 6.
Figure 7B:
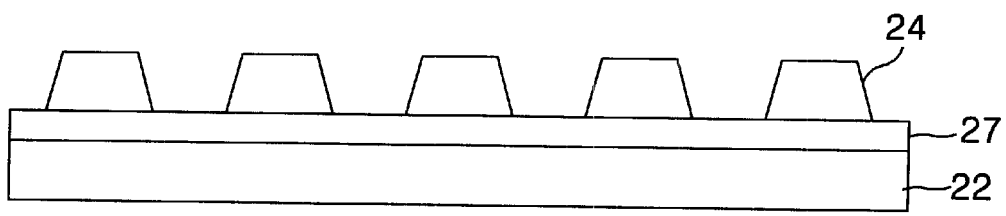
FIG. 7B is a cross sectional view of the input pads taken along a line C–C' of FIG. 6.
Figure 8:
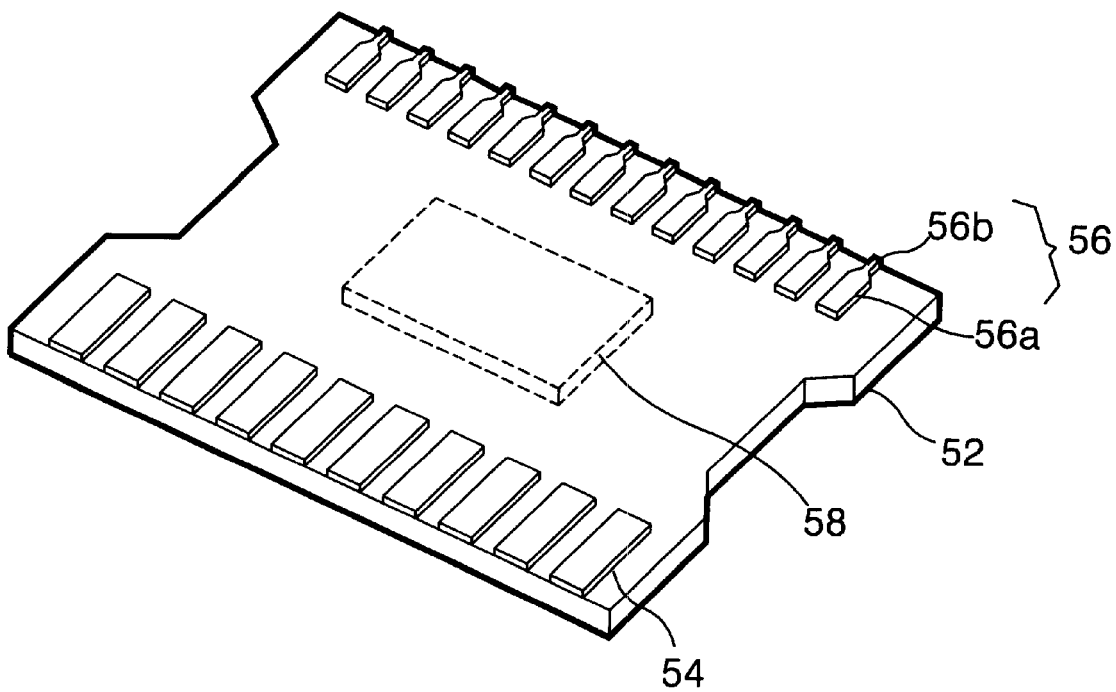
FIG. 8 is a perspective view of a tape carrier package according to an embodiment of the present invention.
Figure 9:
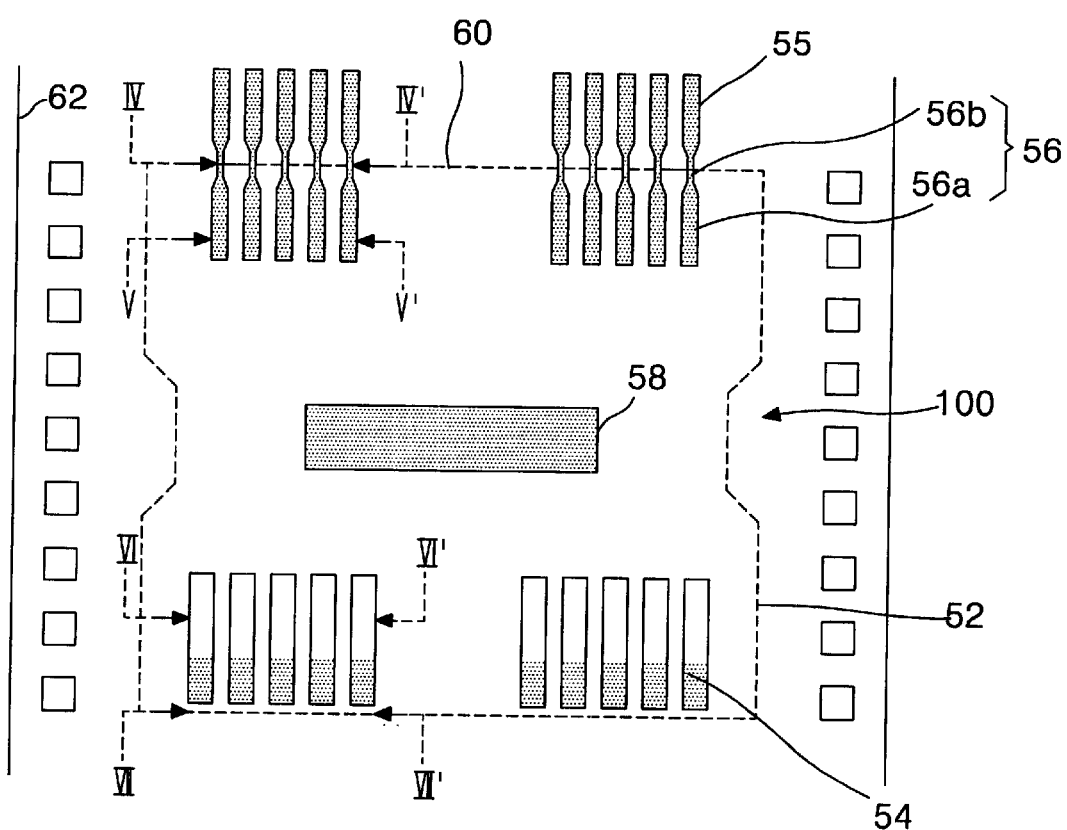
FIG. 9 is a plan view showing the tape carrier package of FIG. 8 in an uncut state.

Referring to FIG. 8 and FIG. 9, there is shown a tape carrier package (TCP) according to an embodiment of the present invention. The TCP includes ICs 58 mounted on a center portion of a base film 52, input pads 54 provided only at the inside of a cutting line 60 of the base film 52, and output pads 56 having a body 56a and a neck 56b that have a different line width from each other. In a process of fabricating a liquid crystal display, the input pads 54 of the TCP are connected, via an ACF (not shown), to the pads on the PWB (not shown). The input pads 54 are provided only at the inside base film area of the cutting line 68 as shown in FIGS. 8 and 9. In other words, the input pads 54 do not extend outside of the cutting line 60, but are formed only inside of the cutting line 60. The input pads 54 preferably extend to the edge of the cutting line 60 as shown in FIG. 8. Alternatively, a small space may be left between the cutting line 60 and the edge of the input pads 54 as shown in FIG. 9.

Figure 10A:
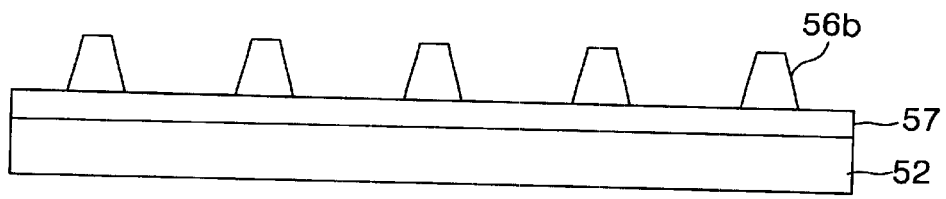
FIG. 10A is a cross sectional view of the input pads taken along the line D–D' of FIG. 9.
Figure 10B:
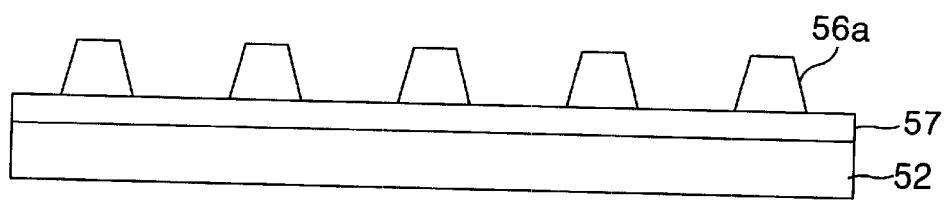
FIG. 10B is a cross sectional view of the input pads taken along the line E–E' of FIG. 9.
Figure 10C:
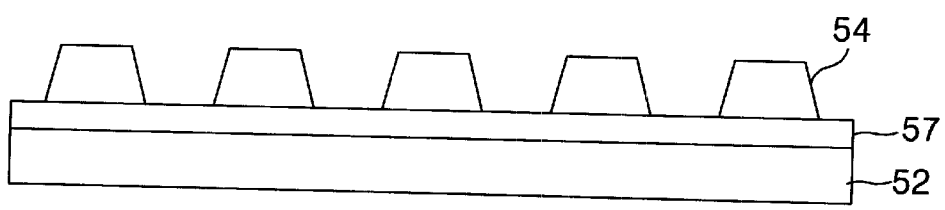
FIG. 10C is a cross sectional view of the input pads taken along the line F–F' of FIG. 9.
Figure 10D:
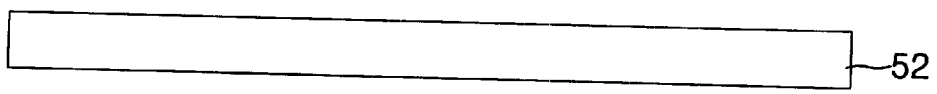
FIG. 10D is a cross sectional view of the input pads taken along the line G–G' of FIG. 9.

The output pads 56 are connected, via the ACF, to the signal line pads (not shown) on a liquid crystal panel. As shown in FIG. 9, each output pad 56 consists of a body 56a with a wide line width, neck 56b with a narrow line width, and a dummy part 55 that is cut away when the TCP is being cut from the FPFR 62. The body 56a is positioned at the inside base film area of the cutting line 60 while the neck 56b is positioned at a cutting line 60. The dummy part 55 extends from the neck 56b and is positioned at an outside area of the cutting line 60. In this case, the dummy part 55 has the same line width as the body 56a. However, it is also possible to form dummy part 55 that have wider or narrower line widths than the body 56a. Such input and output pads 54 and 56 have a two-layer structure in which copper(Cu) is plated with tin(Sn) for preventing oxidation. Also show in FIGS. 10A–C is an optional bonding film 57, which adheres the pads 54, 56 to the base film 52.

The neck 56b can be formed with a width of approximately 30% of the width of the body 56a when the output pads 56 have a pitch of approximately 70 microns. In this case, the defect ratio of the output pads (or wiring) is below 50%. However, the width of the neck 56b of the output pad 56 is preferably about 30.30 microns when the body 56a has a width of approximately 35.30 microns. This is because the neck 56b may be bent when it has a width of 20 microns.

The dummy parts 55 of the output pads 56 and the input pads 54 formed on the FPFR 62 contact probes of a tester (not shown) in an uncut state. In this state, a test is performed for judging whether or not there is a defect in the ICs, the pads 54, 56 and/or the interconnection pattern between the pads 54, 56 and the ICs in the TCP. Because the input pads 54 are relatively wider and longer than the output pads 56, it is possible to connect the probes of the tester to the input pads 54 without the need for extensions of the input pads 54 past the cutting line 60. However, because the output pads 56 are relatively shorter and narrower than the input pads 54, it is necessary to include the dummy parts 55 to provide sufficient space to connect the probes of the tester to the output pads 56.

After the test has been completed, the base film 52 and the necks 56b of the output pads 56 are cut along the cutting line 60. At this time, since the input pads 54 do not exist on the cutting line 60 and the necks 56a are set to have a small line width, friction between the pads 56 and the cutter is greatly reduced. Accordingly, the generation of a conductive alien substance during the cutting can be prevented. The TCP cut in this manner is loaded into a pad bonding equipment (not shown). Upon pad bonding, the input and output pads 54, 56 of the TCP are opposed to the PWB and the liquid crystal panel 2 with the ACF therebetween. Subsequently, the input pads 54 and the pads on the PWB, or the output pads 56 and the pads on the liquid crystal panel 2 is pressurized in a state of heating the ACF. At this point, the input and output pads 54 and 56 of the TCP and the PWB or the pads on the liquid crystal panel 2 are electrically connected to each other by conductive particles within the ACF. Accordingly, a conductive alien substance is not generated, or a conductive alien substance with a very small size is generated in the cutting process, so that the chance of a short among the pads 54, 56, including the pads on the PWB, is greatly reduced.

As described above, according to the present invention, the pads are provided at the inner base film area of the cutting line or provided on the cutting line in such a manner to have a narrow line width, so that it is possible to minimize a conductive alien substance generated during the cutting. Accordingly, the TCP according to the present invention can greatly reduce the chance of a short between pads from being generated when the TCP is bonded to a PWB or liquid crystal panel.

Although the present invention has been illustrated explained by the embodiments shown in the drawings described above, it should be understood by one of ordinary skill in the art that the invention is not limited to the embodiments, described above but rather that various changes or modifications thereof are possible without departing from the spirit of the invention. Accordingly, the scope of the invention shall be limited only by the appended claims and their equivalents.

What is claimed is:

1. A tape carrier package for connecting a liquid crystal panel and a print wiring board, the tape carrier package comprising:
   a base film;
   an integrated circuit mounted on the base film;
   a plurality of input pads connected to the integrated circuit to input exterior input signals to the integrated circuit, wherein the plurality of input pads are provided only at the inside of a cutting line of the base film; and
   a plurality of output pads connected to the integrated circuit, each of said output pads including a first portion connected to the integrated circuit and a second portion extending from the first portion, the second portion having a narrower line width than the first portion.

2. The tape carrier package according to claim 1, wherein the output pads are connectable to signal pads on the liquid crystal panel.

3. The tape carrier package according to claim 2, wherein line widths of the input pads are larger than line width of the output pads, and a total number of the output pads is larger than a total number of the input pads.

4. The tape carrier package according to claim 1, wherein said input pads are positioned at an inner effective area of the cutting line such that the input pads are not cut.

5. A method of fabricating a tape carrier package for connecting a liquid crystal panel to a printed wiring board, comprising the steps of:
   forming input pads on a base film at an inside of a cutting line of the tape carrier package;
   forming a plurality of output pads on the base film, each of the output pads including a first portion connectable to an integrated circuit on the base film, a second portion extending from the first portion and positioned at the cutting line, the second portion having a narrower line width than the first portion, and a third portion extended from the second portion, the third portion having a wider line width than the second portion;
   mounting the integrated circuit on the base film;
   connecting the input pads and the first portions to the integrated circuit; and
   cutting the base film along the cutting line.

6. A method of connecting a liquid crystal panel to a printed circuit board, the method comprising the steps of:
   providing a printed circuit board, the printed circuit board having a plurality of output pads;
   providing a liquid crystal panel, the liquid crystal panel having a plurality of input pads, the plurality of input pads are provided only at the inside of a cutting line of a base film;
   providing a base film;
   mounting an integrated circuit to the base film, the integrated circuit having a first set of terminals for inputting signals from a printed circuit board and a second set of terminals for outputting signals to a liquid crystal panel;
   forming a first set of pads on the base film;
   forming a second set of pads on the base film;
   connecting the first set of pads to the first set of terminals;
   connecting the second set of pads to the second set of terminals;
   cutting the base film in a shape corresponding to a tape carrier package;
   connecting the output pads of the printed circuit board to the first set of pads; and
   connecting the input pads of the liquid crystal panel to the second set of pads;
   wherein at least one pad from the second set of pads is formed with a first portion connected to the integrated circuit and a second portion extending from the first portion, the second portion having a narrower line width than the first portion, and the cutting step is performed such that the second portion of the pad is cut.

7. The method of claim 6, wherein at least one pad from the first set of pads is formed such that no portion of the pad extends past a line along which the base film is cut in the cutting step.

8. The method of claim 6, wherein the at least one pad from the second set of pads further includes a third portion connected to the second portion, the third portion having a line width different from the line width of the second portion.

9. The method of claim 8, wherein the line width of the third portion is approximately equal to the line width of the first portion.

10. The method of claim 6, wherein the line width of the second portion is approximately equal to the greater of thirty percent of the line width of the first portion and twenty microns.

11. The method of claim 6, wherein the line width of the second portion is approximately equal to thirty percent of the line width of the first portion.

12. The method of claim 6, wherein all of the pads from the second set of pads are formed such that each pad has a first portion connected to the integrated circuit and a second portion extending from the first portion, the second portion having a narrower line width than the first portion, and the cutting step is performed such that the second portion of the pad is cut, and all of the pads from the first set of pads are formed such that no pad from the first set of pads is cut during the cutting step.

* * * * *